United States Patent [19]

Yoo et al.

[11] Patent Number: 5,140,190

[45] Date of Patent: Aug. 18, 1992

[54] OUTPUT CIRCUIT FOR A BIPOLAR COMPLEMENTARY METAL OXIDE SEMICONDUCTOR

[75] Inventors: Hah Y. Yoo, Jung-Gu; Young M. Kim, Seo-Gu; Jin I. Hyun, Yu-Sung, all of Rep. of Korea

[73] Assignees: Electronics and Telecommunications Research Institute, Daejeon; Korea Telecommunication Authority, Seoul, both of Rep. of Korea

[21] Appl. No.: 696,220

[22] Filed: May 6, 1991

[30] Foreign Application Priority Data

May 8, 1990 [KR] Rep. of Korea ............... 1990-6493

[51] Int. Cl.⁵ .......................................... H03K 19/02
[52] U.S. Cl. ..................................... 307/446; 307/570
[58] Field of Search ................................. 307/446, 570

[56] References Cited

U.S. PATENT DOCUMENTS 5,038,057  8/1991  Dixon et al. .................... 307/446

Primary Examiner—David Hudspeth
Assistant Examiner—Andrew Sanders
Attorney, Agent, or Firm—Blakely, Sokoloff, Taylor & Zafman

[57] ABSTRACT

An output circuit for a bipolar complementary metal oxide semiconductor. The circuit is formed by coupling P channel and N channel metal oxide semiconductor transistors to bipolar transistors to obtain both a low logic level state of 0 volts and a high logic level state of 5 volts.

2 Claims, 2 Drawing Sheets

OUTPUT CIRCUIT FOR A BIPOLAR COMPLEMENTARY METAL OXIDE SEMICONDUCTOR

BACKGROUND OF THE INVENTION

1. Field of the Invention

The invention relates to an output circuit for a bipolar complementary metal oxide semiconductor (BICMOS) obtained by coupling a bipolar transistor with a metal oxide semiconductor, and more particularly, to an output circuit for BICMOS used in the each output terminal of a plurality of logic gates which is the basic element of a logic circuit, to thereby obtain both a low potential state of 0 V (low state) and a high potential state of 5 V (high state).

2. Information Disclosure Statement

Generally, in the prior art BICMOS inverter circuit, as shown in FIG. 1, which is the basic element of BICMOS logic circuit and used in the output terminal of a plurality of logic gates, the circuit comprises a first power supply node N2 connected to a high power supply, a second power supply node N3 connected to a low power supply, a P channel MOS transistor M1 and N channel MOS transistor M2, which are positioned on the path between an input node N1 and an output node N4 and determine logic state, NPN bipolar transistors Q1 and Q2 which are operated as an inverter according to the logic state determined by the MOS transistors M1 and M2, impedances Z1 and Z2 which enable the rapid discharge of the electric charge in the base electrode when transferring the output of the circuit.

The impedances Z1 and Z2 which are connected to MOS transistors M1 and M2 respectively, are configured to operate in the opposite conducting states to the MOS transistors to which the impedances are connected.

Thus, if a high voltage of 5 V is applied to the input node N1, the P channel MOS transistor M1 becomes non-conducting state (OFF), and the P channel MOS transistor M2 becomes conducting state (ON), and the impedance Z1 becomes conducting state or equivalent state, and the impedance Z2 becomes non-conducting state or equivalent state.

Accordingly, the electric charge stored in the base electrode of the bipolar transistor Q1 is discharged through the impedance Z1, thereby it becomes non-conducting state, and the electric charge stored in the condenser Co supplies current, through the N channel MOS transistor M2 with conducting state, to the base electrode of the bipolar transistor Q2, to thereby make the bipolar transistor Q2 conducting state.

Thus, the current which is the product of the base current and the current gain is to the collector-emitter electrode path, and the electric charge in the condenser Co is rapidly discharged, to thereby decrease the potential at the output node N4. Where, the bipolar transistor Q2 becomes non-conducting state upon reduction of current supplied from the condenser by lowering the potential of the condenser to the low potential.

On the other hand, the P channel MOS transistor M1 and impedance Z2 become conducting state upon applying the low voltage of 0 V to the input node N1, thereby the N channel MOS transistor M2 and impedance Z1 become Non-Conducting state.

Accordingly, the electric charge stored in the base electrode of the bipolar transistor Q2 is discharged through the impedance Z2, thereby it becomes non-conducting state, at the same time, the current supplied through the P channel MOS transistor is applied to the base electrode of the bipolar transistor Q1, thereby is becomes conducting state.

Thus, the current larger than the base current by the value of product of the current gain is applied to the collector-emitter electrode path of the bipolar transistor Q1, thereby the condenser Co is charged and the potential at the output node N4 become high.

Next, when the potential becomes the desired high potential by charging the condenser Co, the potential difference between the base electrode and the emitter electrode of the bipolar transistor Q1 becomes small value and Q2 becomes non-conducting state.

However, though the above mentioned prior art BICMOS output circuit has the same power consumption characteristic as the CMOS due to the current being conducted only during the transient time of the output, and has a more rapid transient time than that of the CMOS due to the large current supplied from the bipolar transistors Q1 and Q2 when Co is large there is a disadvantage in that the prior art BICMOS output circuit has the logic level voltage of 0.5 V and 4.5 V instead of the full swing logic level voltage of 0 V and 5 V, because the current is conducted only during the transient time like CMOS and the bipolar transistors Q1 and Q2 used as the last output terminal are non-conducting state, which has the potential difference between the base electrode and the emitter electrode thereby about 0.5 V.

Accordingly, though, there is no problem, when the prior art BICMOS output circuit is used in the IC internal circuit, there is problem that the undesired operation is occurred due to the decrease of the noise margin at the each input and output terminal, when it is used with TTL circuit.

Therefore, it is an object of the present invention to privide an output circuit for BICMOS which has a logic level change of full swing between 0 V and 5 V.

BRIEF DESCRIPTION OF THE DRAWINGS

For fuller understanding of the nature and objects of the invention, reference should be made to the following detailed descriptions in conjunction with the accompanying drawings in which.

Similar reference characters refer to similar parts throughout the several views of the drawings.

The features of the present invention may be understood from the accompanying description in conjunction with the accompanying drawing.

DETAILED DESCRIPTION OF THE INVENTION

Figure 1:
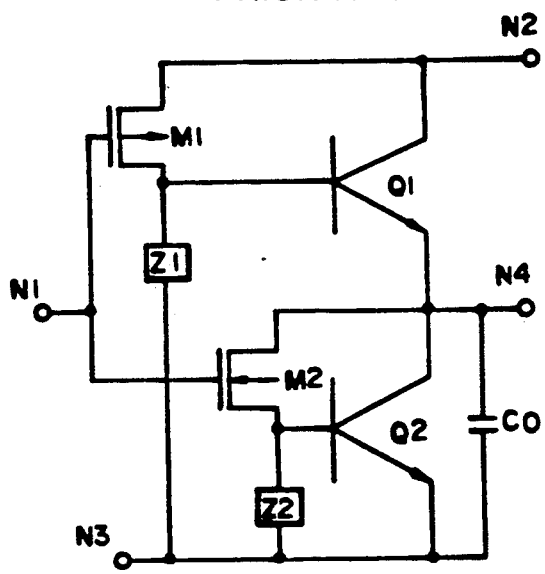
FIG. 1 illustrates a circuit diagram of the prior art output circuit for BICOMS.
Figure 2:
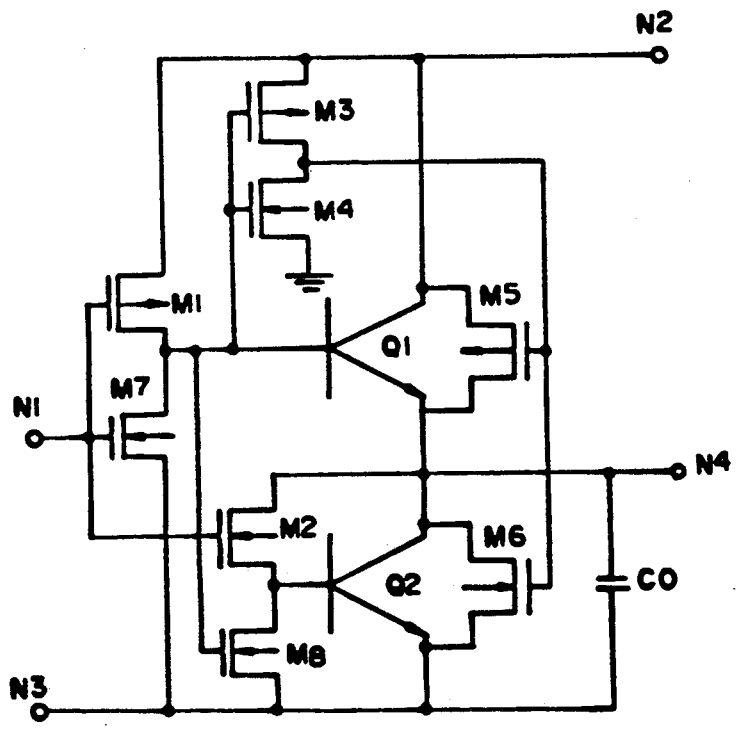
FIG. 2 illustrates a circuit diagram according to the present invention.

FIG. 2 illustrates an output circuit for a Bipolar complementary metal oxide semiconductor, Where in, an input node N1 is connected to the each gate electrode of a P channel MOS transistor M1 and N channel MOS transistors M2, M7, a first power supply node N2 is connected to the each drain electrode of P channel MOS transistors M1, M3, M5, and to the collector electrode of a bipolar transistor Q1, a second power supply node N3 is connected to the each source electrode of N channel MOS transistors M7, M8, and to the emitter electrode of a bipolar transistor Q2, and to the one terminal of a condenser Co, an output node N4 is connected to the source electrode of a P channel transistor M5, and to the each drain electrode of N channel MOS transistors M2, M6, and to the emitter electrode of the transistor Q1, and to the collector electrode of the transistor Q2, and to the another terminal of the condenser Co, the P channel MOS transistor M1 has a source electrode connected to the drain electrode of the N channel MOS transistor M7, and to the gate electrode of the P channel MOS transistor M3, and to the each gate electrode of an N channel MOS transistor M4 and the N channel MOS transistor M8 and the bipolar transistor Q1, the P channel MOS transistor M3 has a source electrode connected to the drain electrode of the N channel MOS transistor M4, the source electrode of which is connected to ground, and to the each gate electrode of the P channel MOS transistor M5 and N channel MOS transistor M6, the N channel MOS transistor M2 has a source electrode connected to the drain electrode of the n channel MOS transistor M8, and to the base electrode of the bipolar transistor Q2.

Where, transistors M1,M2,M3 and M4 are coupled to constitute an inverter.

In the above mentioned output circuit for BICMOS according to the present invention, if the high voltage of 5 V is applied from the input node N1, the P channel MOS transistor M1 becomes non-conducting state, and the N channel MOS transistors M2 and M7 become conducting state. Thus, the low state potential is transferred to the node between M7 and M1 through the drain-source electrode of the N channel MOS transistor M7, thereby P channel MOS transistor M3 becomes conducting state and N channel MOS transistors M4 and M8 and bipolar transistor Q1 become non-conducting state.

Thus, the P channel MOS transistor M5 becomes non-conducting state and the N channel MOS transistor M6 becomes conducting state due to the high voltage passed from the drain-source electrode of the P channel MOS transistor M3.

Next, the electric charge charged in the condenser Co is conducted to the drain-source electrode of M2 and as a result the bipolar transistor Q2 becomes conducting state. In this state, the electric charge charged in the condenser Co is discharged through the bipolar transistor Q2 and the N channel MOS transistor M6, at the same time, so that the discharging velocity becomes rapid and the potential at the output node N4 becomes low state.

On the other hand, if the low voltage of 0 V is applied from the input node N1, the P channel MOS transistor M1 becomes conducting state, the N channel MOS transistors M2 and M7 become non-conducting state.

Accordingly, the P channel MOS transistor M3 becomes non-conducting state and the N channel MOS transistors M4 and M8 and the bipolar transistor Q1 become conducting state due to the high voltage of 5 V passed from the drain-source electrode path of the P channel MOS transistor M1.

Next, the bipolar transistor Q2 becomes non-conducting state due to the non-conducting state of the N channel MOS transistor M2, thereby the P channel MOS transistor M5, connected to low potential through M4, becomes conducting state and the N channel MOS transistor M6 becomes non-conducting state.

Accordingly, the high voltage of 5 V is applied rapidly from the first power supply node N2, through the collector-emitter electrode path of the bipolar transistor Q1 and the drain-source electrode path of the P channel MOS transistor M5 with conducting state, thereby the potential at the output node N4 becomes high. Where, the bipolar transistor Q2 and the N channel MOS transistor M6 are non-conducting state so that the high voltage is applied to the output node N4 and condenser Co.

Thus, the condenser Co is rapidly charged to the desired potential (5 V), thereby the transistors Q1 and M5 become non-conducting state.

Figure 3:
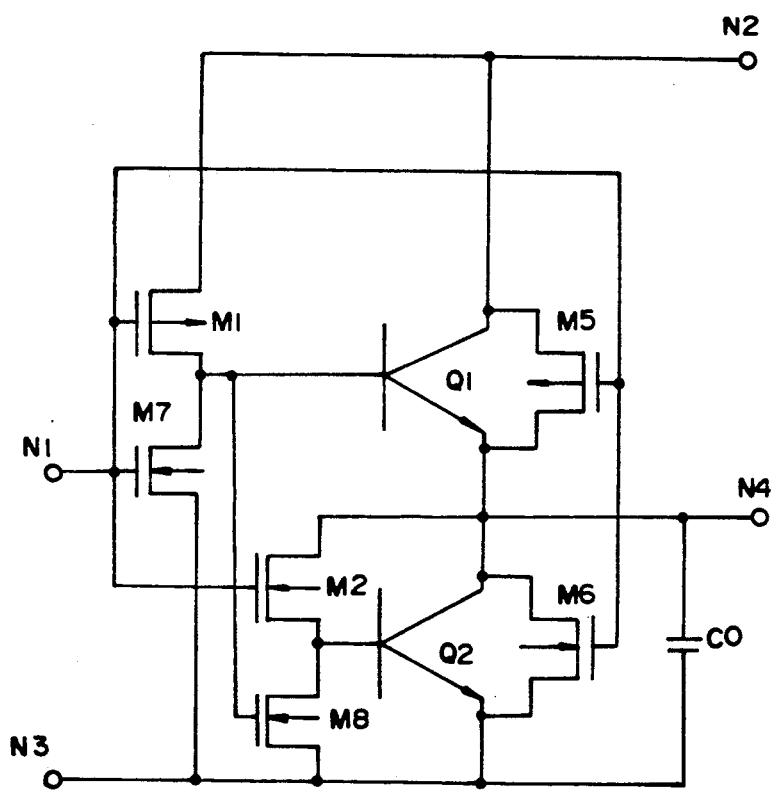
FIG. 3 illustrates another example according to the present invention.

FIG. 3 illustrates an another example of an output circuit for a Bipolar complementary metal oxide semiconductor Where in, an input node N1 is connected to the each gate electrode of a P channel MOS transistor M1 and N channel MOS transistor M2, M6, M7, a first power supply node N2 is connected to the each drain electrode of P channel MOS transistors M1, M3, M5, and to the collector electrode of a bipolar transistor Q1, a second power supply node N3 is connected to the each source electrode of N channel MOS transistors M6, M7, M8, an to the emitter electrode of a bipolar transistor Q2, and to the one terminal of a condenser Co, an output node N4 is connected to the source electrode of a P channel transistor M5, and to the each drain electrode of N channel MOS transistors M2, M6, and to the emitter electrode of the transistor Q1, and to the collector electrode of said transistor Q2, and to the another terminal of said condenser Co, said P channel MOS transistor M1 has a source electrode connected to the drain electrode of said N channel MOS transistor M7, and to the base electrode of said bipolar transistor Q1, and to the gate electrode of the N channel MOS transistor M8, the N channel MOS transistor M2 has a source electrode connected to the drain electrode of the N channel MOS transistor M8, and to the base electrode of the bipolarr transistor Q2.

Accordingly, if the high voltage of 5 V is applied from the input node N1, the P channel MOS transistors M1 and M2 become non-conducting state, and the N channel MOS transistors M2,M6 and M7 become conducting state.

Next, the bipolar transistor Q1 connected to the drain electrode of the N channel MOS transistor M7 becomes non-conducting state and the N channel MOS transistor M8 become non-conducting state, and the bipolar transistor Q2 becomes conducting state by the current flowing from condenser Co to the base electrode of Q2 through M2, as a result the electric charge charged in the condenser Co is rapidly discharged through the bipolar transistor Q2 and N channel MOS transistor M6, thereby the potential at the output node N4 becomes low.

On the other hand, if the low voltage of 0 V is applied from the input node N2, the P channel MOS transistors M1 and M5 become conducting state, and the N channel MOS transistors M2, M6 and M7 become non-conducting state. Next, the bipolar transistor Q1 and N channel MOS transistor M8 become conducting state due to the P channel MOS transistor M1 with conducting state so that the electric charge in the base electrode of the bipolar transistor Q2 is discharged.

Therefore the bipolar transistor Q2 becomes non-conducting state. Thus, the high voltage of 5 V from the first power supply N2 is applied, through the bipolar transistor Q1 and P channel MOS transistor M5, to the output node N4 and condenser Co.

Where, the n channel MOS transistors M2 and M6 and the bipolar transistor Q2 is in non-conducting state therefore the condenser Co is charged.

If the potentials of the emitter electrode of the transistor Q2 and the source electrode of the transistor M5 become the desired potential, they become non-conducting state.

As mentioned above, in the BICMOS output circuit of the present invention, the current is conducted through the bipolar transistor and the MOS transistor so that the transient is rapidly performed and the current is transferred without the voltage up and down around the output node N4. Thus, when the logic is transient, the full swing between 0 V and 5 V is obtained.

The output circuit of the first example comprising the inverter circuit of above two MOS transistors M3, M4 can be applied to the all logic circuit.

However, only when the inverter circuit is used, the output circuit of the second example comprising the two MOS transistors M5 and M6 having each gate electrode connected directly to the input node N2, in which the two MOS transistors M3, M4 are abreviated, is used so that the number of the elements is reduced and the effect of the cost reduction is obtained.

What is claimed is:

1. An output circuit for a Bipolar complementary metal oxide semiconductor comprising:
   an input node connected to a gate electrode of a first P channel MOS transistor and to a respective gate electrode of first and second N channel MOS transistors;
   a first power supply node connected to a drain electrode of said first P channel MOS transistor and to a respective drain electrode of second and third P channel MOS transistors, and to a collector electrode of a first bipolar transistor;
   a second power supply node connected to a source electrode of said second N channel MOS transistor, to a source electrode of a third N channel MOS transistor, and to an emitter electrode of a second bipolar transistor, and to one terminal of a condenser;
   an output node connected to a source electrode of said third P channel transistor, and to a drain electrode of said first N channel MOS transistor, to a drain electrode of a fourth N channel MOS transistor, and to an emitter electrode of said first bipolar transistor, and to a collector electrode of said second bipolar transistor, and to an other terminal of said condenser;
   said first P channel MOS transistor having a source electrode connected to a drain electrode of said second N channel MOS transistor, and to a gate electrode of said second P channel MOS transistor, and to a gate electrode of a fifth N channel MOS transistor and to a gate electrode of said third N channel MOS transistor and to a base electrode of said first bipolar transistor;
   said second P channel MOS transistor having a source electrode connected to a draim electrode of said fifth N channel MOS transistor, a source electrode of which is connected to ground, and to a gate electrode of said third P channel MOS transistor and to a gate electrode of said fourth N channel MOS transistor; and
   said first N channel MOS transistor having a source electrode connected to a draim electrode of said third N channel MOS transistor, and to a base electrode of said second bipolar transistor.

2. An output circuit for a Bipolar complementary metal oxide semiconductor comprising:
   an input node connected to a gate electrode of a first P channel MOS transistor and to a respective gate electrode of a second P channel MOS transistor and of first, second and third N channel MOS transistors;
   a first power supply node connected to a drain electrode of said first P channel MOS transistor and of said second P channel MOS transistor, and to a collector electrode of a first bipolar transistor;
   a second power supply node connected to a source electrode of said second and said third N channel MOS transistors and to a source electrode of a fourth N channel MOS transistor, and to an emitter electrode of a second bipolar transistor, and to one terminal of a condenser;
   an output node connected to a source electrode of said second P channel MOS transistor, and to a drain electrode of said first and of said second N channel MOS transistors, and to an emitter electrode of said first bipolar transistor, and to a collector electrode of said second bipolar transistor, and to an other terminal of said condenser;
   said first P channel MOS transistor having a source electrode connected to a drain electrode of said third N channel MOS transistor, and to a base electrode of said first bipolar transistor, and to a gate electrode of said fourth N channel MOS transistor; and
   said first N channel MOS transistor having a source electrode connected to a drain electrode of said fourth N channel MOS transistor, and to a base electrode of said second bipolar transistor.

* * * * *